(12) United States Patent
Koch

(10) Patent No.: US 9,678,190 B2
(45) Date of Patent: Jun. 13, 2017

(54) SYSTEM AND METHOD FOR GENERATING MR PHASE CONTRAST IMAGES NEAR METAL

(75) Inventor: Kevin M. Koch, Milwaukee, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 1129 days.

(21) Appl. No.: 13/441,088

(22) Filed: Apr. 6, 2012

(65) Prior Publication Data

US 2013/0265046 A1    Oct. 10, 2013

(51) Int. Cl.
  *G01R 33/565* (2006.01)
  *G01R 33/24* (2006.01)

(52) U.S. Cl.
  CPC ...... *G01R 33/56536* (2013.01); *G01R 33/243* (2013.01)

(58) Field of Classification Search
  USPC ............ 324/300–322; 600/407–435; 382/128–131
  See application file for complete search history.

(56) References Cited

U.S. PATENT DOCUMENTS

| 4,899,109 | A | 2/1990 | Tropp et al. | |
| 5,537,039 | A | 7/1996 | Le Roux et al. | |
| 6,150,815 | A | 11/2000 | Janzen et al. | |
| 6,445,182 | B1 | 9/2002 | Dean et al. | |
| 6,584,337 | B2 | 6/2003 | Dumoulin et al. | |
| 7,557,575 | B2 | 7/2009 | Ookawa et al. | |
| 7,573,269 | B2 | 8/2009 | Yao | |
| 7,800,368 | B2 | 9/2010 | Vaughan et al. | |
| 8,378,678 | B2 * | 2/2013 | Schmitt | G01R 33/4818 324/307 |
| 8,605,975 | B2 * | 12/2013 | Pan et al. | 382/130 |
| 8,781,197 | B2 * | 7/2014 | Wang | G01R 33/54 382/131 |
| 8,923,587 | B2 * | 12/2014 | Pan et al. | 382/130 |
| 2005/0030023 | A1 | 2/2005 | Bangerter et al. | |
| 2005/0054910 | A1 * | 3/2005 | Tremblay | A61B 5/055 600/411 |

(Continued)

OTHER PUBLICATIONS

Butts et al., "Correction of Slice Profile Distortion from Metallic Devices," Proc. Intl. Soc. Mag. Reson. Med., vol. 14, p. 2380, 2006.

(Continued)

*Primary Examiner* — Melissa Koval
*Assistant Examiner* — Tiffany Fetzner

(57) ABSTRACT

A system and method for generating MR phase contrast images near metal include an MRI apparatus that includes an MRI system having a plurality of gradient coils and an RF transceiver system and an RF switch controlled by a pulse module to transmit RF signals to an RF coil assembly. The MRI apparatus also includes a computer programmed to acquire a plurality of three-dimensional (3D) MR data sets and to generate a plurality of frequency images based on the plurality of 3D MR data sets. Each 3D MR data set is acquired using a central transmit frequency and a central receive frequency set to an offset frequency value that is distinct for each 3D MR data set. The computer is also programmed to convert the plurality of frequency images to a plurality of time domain images and to generate a phase image based on the plurality of time domain images.

15 Claims, 3 Drawing Sheets

(56) References Cited

U.S. PATENT DOCUMENTS

| | | | |
|---|---|---|---|
| 2009/0253983 A1* | 10/2009 | Foo | A61B 5/055 600/420 |
| 2009/0306511 A1 | 12/2009 | Yamagata | |
| 2010/0033179 A1 | 2/2010 | Hargreaves et al. | |
| 2010/0205143 A1* | 8/2010 | Kroeker | G01R 33/4818 324/307 |
| 2010/0308827 A1 | 12/2010 | Koch et al. | |
| 2011/0044524 A1* | 2/2011 | Wang | G01R 33/54 382/131 |
| 2011/0044546 A1* | 2/2011 | Pan et al. | 382/195 |
| 2013/0119990 A1* | 5/2013 | Schmitt | G01R 33/4818 324/322 |
| 2013/0265046 A1* | 10/2013 | Koch | 324/309 |
| 2014/0161332 A1* | 6/2014 | Pan et al. | 382/130 |

OTHER PUBLICATIONS

Butts et al., "Reduction of Blurring in View Angle Tilting MRI," Magnetic Resonance in Medicine, vol. 53, pp. 418-424, 2005, Wiley-Liss, Inc.

Volk et al., "Chemical Shift-Specific Slice Selection. A New Method for Chemical Shift Imaging at High Magnetic Field." Journal of Magnetic Resonance, vol. 71, pp. 168-174, 1987.

Skare et al., "Correction of MR Image Distortions Induced by Metallic Objects Using a 3D Cubic B-Spline Basis Set: Application to Stereotactic Surgical Planning," Magnetic Resonance in Medicine, vol. 54, pp. 169-181, 2005.

Edelman et al., "Gadolinium-Enhanced Off-Resonance Contrast Angiography," Magnetic Resonance in Medicine, vol. 57, pp. 475-484, 2007, Wiley-Liss, Inc.

Dahnke et al., "Optimal Positive Contrast of Labeled Cells via Conventional 3D Imaging." Proc. Intl. Soc. Mag. Reson. Med., vol. 14, p. 361, 2006.

Cunningham et al., "Positive Contrast Magnetic Resonance Imaging of Cells Labeled with Magnetic Nanoparticles," Magnetic Resonance in Medicine, vol. 53, pp. 999-1005, 2005, Wiley-Liss, Inc.

Koch et al., "Z-Selective Multi-Spectal 3D Imaging: A MAVRIC-SEMAC Hybrid," Oral Presentation, 2010 ISMRM Annual Meeting, pp. 1-13.

Koch et al., "A Multispectral Three-Dimensional Acquisition Technique for Imaging Near Metal Implants," Magnetic Resonance in Medicine, vol. 61, pp. 381-390, 2009.

Lu et al., "SEMAC: Slice Encoding for Metal Artifact Correction in MRI," Magnetic Resonance in Medicine, vol. 62, pp. 66-76, 2009.

Koch et al., "MAVRIC Imaging Near Metal Implants with Improved Spatial Resolution and Reduced Acquisition Time," Poster, 2010 ISMRM Annual Meeting, p. 1.

Jezzard et al., "Correction for Geometric Distortion in Echo Planar Images from Bo Field Variations," Magnetic Resonance in Medicine, vol. 34, pp. 65-73, 1995.

Koch et al., "Imaging Near Metal with a MAVRIC-SEMAC Hybrid," Magnetic Resonance in Medicine, pp. 1-12, 2010.

Chang et al., "A Technique for Accurate Magnetic Resonance Imaging in the Presence of Field Inhomogeneities," IEEE Transactions on Medical Imaging, vol. 11, No. 3, pp. 319-329, Sep. 1992.

Koch et al., "Jacobian-Based Correction of 3D-MSI Images Near Implanted Metal Devices," p. 1, Apr. 17, 2010.

Andersson et al., "How to correct susceptibility distortions in spin-echo echo-planar images: application to diffusion tensor imaging," NeuroImage, vol. 20, pp. 870-888, 2003.

Holland et al., "Efficient correction of inhomogeneous static magnetic field-induced distortion in Echo Planar Imaging," NeuroImage, vol. 50, pp. 175-183, 2010.

Dutch Novelty Search Report with English translation issued Feb. 25, 2015 in relation to corresponding NL patent application 2010571.

Koch, K.M. et al, "Extracting Phase Contrast from MAVRIC Images Near Metal Implants," Proceedings of the International Society for Magnetic Resonance in Medicine, 2012 Annual Meeting Proceedings, p. 222, May 5, 2012, XP040575353, Melbourne, Australia.

\* cited by examiner

SYSTEM AND METHOD FOR GENERATING MR PHASE CONTRAST IMAGES NEAR METAL

BACKGROUND OF THE INVENTION

Embodiments of the invention relate generally to magnetic resonance (MR) imaging and, more particularly, to generating MR phase contrast images from a region-of-interest (ROI) near metal.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The use of MR in musculoskeletal (MSK) diagnostics is a rapidly growing field. Arthroplasty is the surgical placement of implants. The population of patients having some form of metal implant is quite large and growing rapidly. MR has significant capabilities in assisting the diagnosis of implant revisions. Using magnetic resonance imaging to assist in clinical diagnostics of MR-compatible arthroplastic implants, however, has proven a fundamentally challenging problem. Most materials that are robust and durable enough to utilize for bone replacements will have magnetic properties that, when placed in a typical $B_0$ magnetic field, induce extraneous fields of amplitude and spatial variation that are large compared to the field offsets utilized in conventional spatial encoding. Accordingly, these materials can introduce distortions in the main magnetic field resulting in an inhomogeneous magnetic field.

MR imaging in the presence of metal hardware has developed increasing importance in view of metal-on-metal implant replacement failure modes that are not detectable via other imaging techniques. The complications from such implants have been attributed to both high rates of wear and hypersensitivity reactions without high wear rates. Unfortunately, conventional magnitude contrast techniques cannot easily differentiate between such soft tissue variations.

Since some of the variation between these tissue constructions involves the presence of high magnetic susceptibility particulate matter, a potential differentiating contrast may be gained from phase analysis of MR images in these regions. However, the substantial $B_o$ perturbations induced by metal render conventional phase-contrast mechanisms useless.

It would therefore be desirable to have a system and method capable of reducing image artifacts near or around implant interfaces to allow for differentiation between and within these classes of local tissue response using MR imaging.

BRIEF DESCRIPTION OF THE INVENTION

In accordance with an aspect of the invention, a magnetic resonance (MRI) apparatus includes an MRI system having a plurality of gradient coils positioned about a bore of a magnet, and an RF transceiver system and an RF switch controlled by a pulse module to transmit RF signals to an RF coil assembly to acquire MR images. The MRI apparatus also includes a computer programmed to acquire a plurality of three-dimensional (3D) MR data sets and to generate a plurality of frequency images based on the plurality of 3D MR data sets. Each 3D MR data set is acquired using a central transmit frequency and a central receive frequency set to an offset frequency value that is distinct for each 3D MR data set. The computer is also programmed to convert the plurality of frequency images to a plurality of time domain images and to generate a phase image based on the plurality of time domain images.

In accordance with another aspect of the invention, a method of magnetic resonance (MR) imaging includes determining a distinct central frequency for each of a plurality of 3D MR data acquisitions, performing the plurality of 3D MR data acquisitions, each 3D MR data acquisition having a central transmit frequency and a central receive frequency set to the distinct central frequency determined therefor, and reconstructing a frequency image for each of the plurality of 3D MR data acquisitions. The method also includes generating a plurality of temporal images based on the reconstructed frequency images and generating a phase image based on the plurality of temporal images.

In accordance with yet another aspect of the invention, a computer readable storage medium having stored thereon a computer program comprising instructions, which, when executed by a computer, cause the computer to set a center transmission frequency and a center reception frequency of a first 3D MR acquisition equal to a first center frequency offset, to execute the first 3D MR acquisition to acquire a first set of 3D MR data, and to set a center transmission frequency and a center reception frequency of a second 3D MR acquisition equal to a second center frequency offset different than the first center frequency offset. The computer program also causes the computer to execute the second 3D MR acquisition to acquire a second set of 3D MR data, to reconstruct a frequency image for each of the first and second sets of 3D MR data, to convert the frequency images to respective first and second time domain images, and to generate a phase image based on the first and second time domain images.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
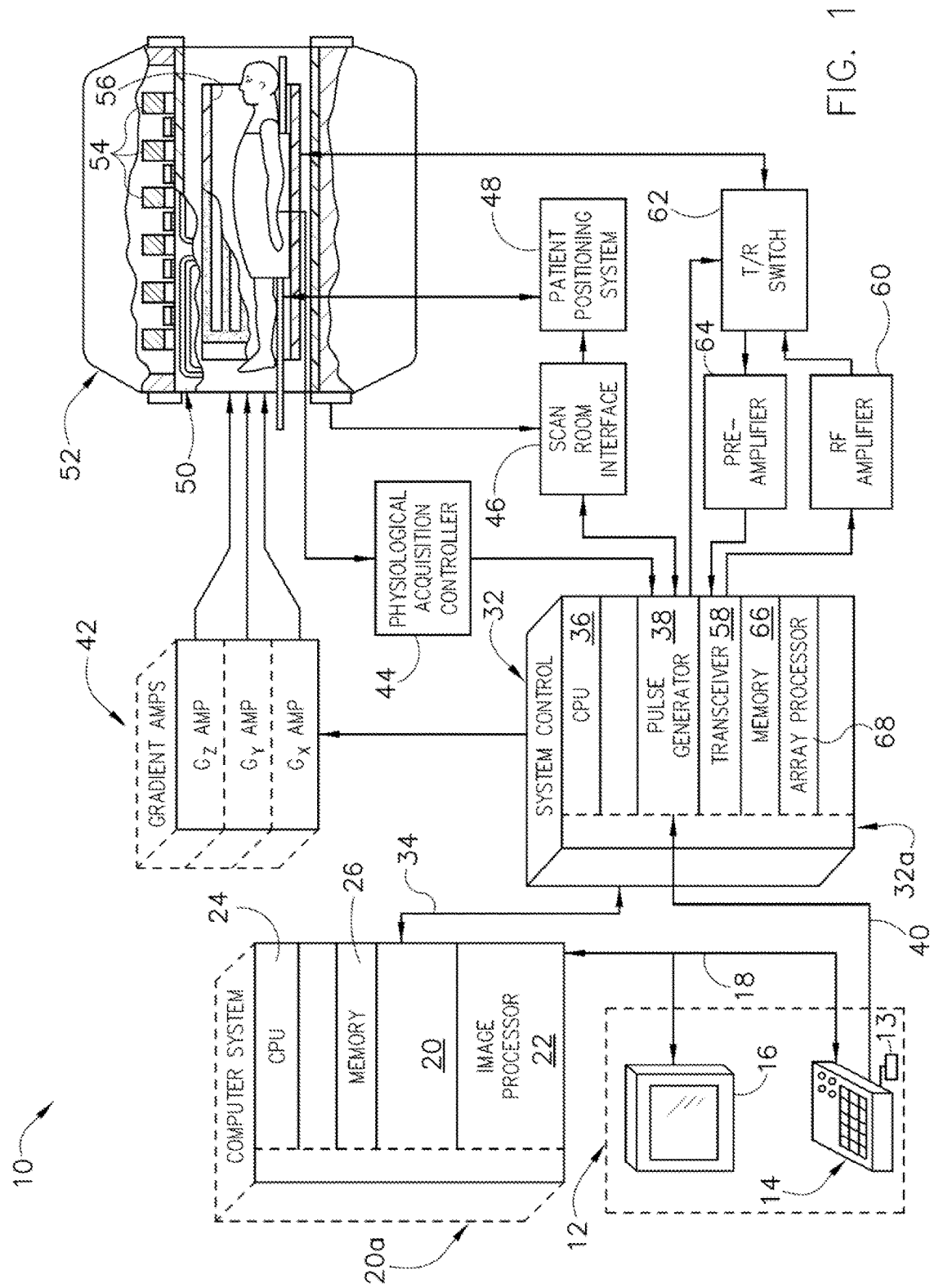
FIG. 1 is a schematic block diagram of an exemplary MR imaging system incorporating embodiments of the present invention.

Referring to FIG. 1, the major components of an exemplary magnetic resonance imaging (MRI) system 10 incorporating embodiments of the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. In an embodiment of the invention, RF coil 56 is a multi-channel coil. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the multi-channel RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
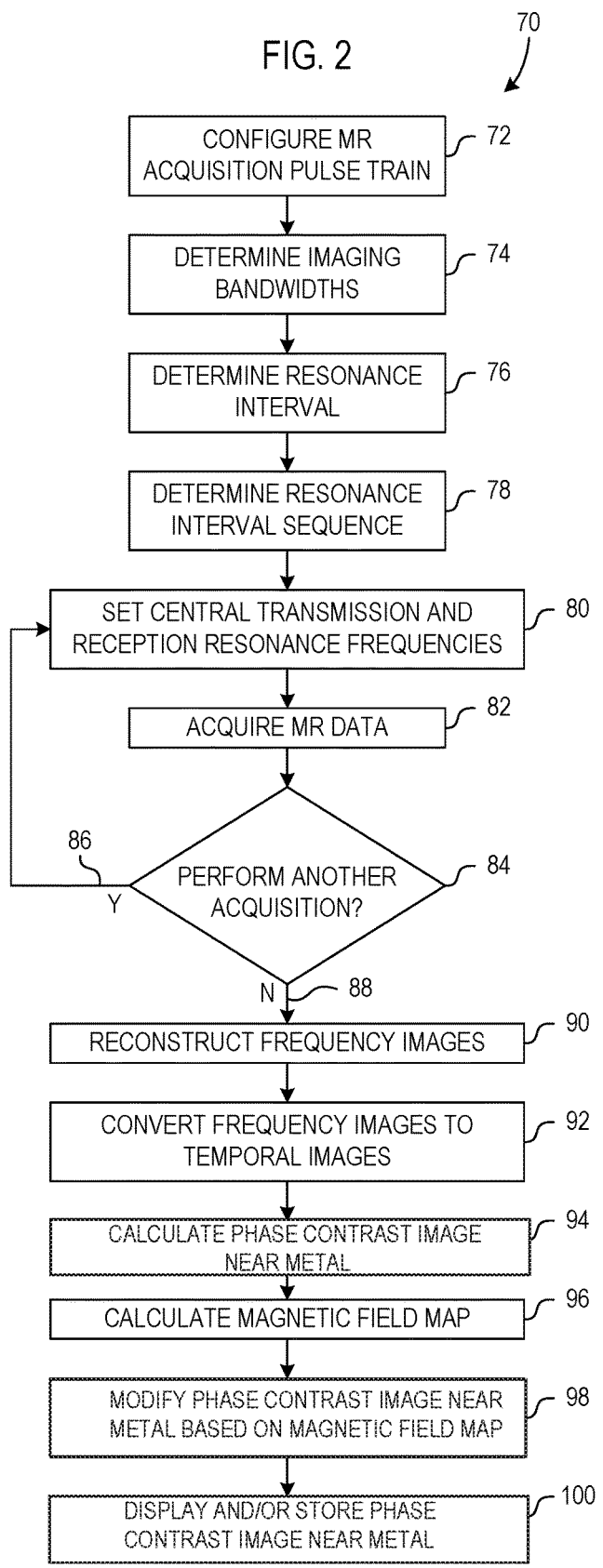
FIG. 2 is a flowchart of an MR imaging technique according to an embodiment of the invention.

FIG. 2 shows a technique 70 for MR imaging near or around patient metallic implants according to an embodiment of the invention. In an embodiment of the invention, technique 70 will be described with respect to 3D Fast Spin Echo (FSE) MR imaging; however, it is contemplated that technique 70 may also apply to 3D spin-echo sequences and other 3D MR acquisition techniques. In an embodiment of the invention, computer system 20 may be programmed to perform technique 70. Technique 70 begins with configuring a pulse train of an MR acquisition pulse sequence at block 72 to be used during each MR acquisition of the MR imaging to acquire a 3D MR data set. The pulse train is configured such that no slab selection imaging gradients are used. In this manner, image reconstruction may be simplified. The shape of pulses of the pulse train within the MR acquisition pulse sequence is also configured. In an embodiment of the invention, a Gaussian pulse shape is used as the shape for pulses of the pulse train. In another embodiment of the invention, the pulse shape used may be based on a spatial-spectral pulse shape or on the shape of a hard or square pulse.

At block 74, imaging bandwidths for the MR acquisitions are determined. An excitation pulse bandwidth for the MR acquisition pulse sequence to be used for acquiring MR data is determined as well as a bandwidth of utilized refocusing pulses. The utilized refocusing pulse bandwidth is determined to be equal to or less than the bandwidth of the excitation pulse. A receiver bandwidth for the receive coil array used to acquire MR data during the MR acquisition pulse sequence is set to a bandwidth larger than that typically used in 3D FSE imaging. In an example, the receiver bandwidth is set to +/−125 kHz. It is contemplated that the receiver bandwidth may also be set to a value greater than +/−125 kHz. In the described technique, off-resonance readout distortion is limited to frequency offsets contained in the RF refocusing band. Setting the receiver bandwidth accordingly helps to minimize this residual readout distortion in reconstructed images.

A resonance interval is determined at block 76 that represents an offset for both the center resonance frequency for transmission and the center resonance frequency for reception between sets of acquired MR data. According to an embodiment of the invention, the resonance interval is less than the bandwidth of the utilized refocusing pulses. At block 78, a resonance interval sequence is determined for acquiring 3D MR data sets. The resonance interval sequence includes offset frequency values, or $B_0$ values, to which central transmission and central reception resonance frequencies are set during MR acquisition. In an embodiment of the invention, the resonance interval sequence includes an offset frequency value of zero. Additional values in the resonance interval sequence include multiples of the resonance interval. For example, the resonance interval sequence may include values for the central transmission and central reception resonance frequencies to be set to each 1 kHz offset step in the range −7 kHz to +7 kHz.

In an embodiment of the invention, the resonance interval sequence is set to interleave or interlace the offset frequency values such that sequential MR acquisitions based on the offset frequency values do not acquire MR data with the central transmission and central reception resonance frequencies set to sequential offset frequency values. For example, an interleaved resonance interval sequence with a 1 kHz resonance interval (or offset step) in the range −7 kHz to +7 kHz may have the following order: [−7, 1, −5, 3, −3, 5, −1, 7, −6, 0, −4, 6, −2, 4, 2 kHz]. Accordingly, neighboring values in the resonance interval sequence are separated by more than the offset step of 1 kHz. Interleaving the resonance interval sequence in this manner reduces interaction between 3D MR data acquisitions in an imaging scan. As described further below, each offset frequency value in the resonance interval sequence is used as the central transmission and reception frequency for a different 3D MR data acquisition. In one embodiment, an MR imaging scan (or protocol) may be configured such that a first set of acquisitions uses a resonance interval sequence with the offset frequency values [−7, 1, −5, 3, −3, 5, −1, 7 kHz] during a single scan and such that a second set of acquisitions uses a resonance interval sequence with the offset frequency values [−6, 0, −4, 6, −2, 4, 2 kHz] during another single scan. The resonance interval sequence values listed above are illustrative only and do not limit the invention. Other and different orders and values for the resonance interval sequence values are considered and are within the scope of the invention.

At block 80, the central transmission and central reception resonance frequencies for a 3D MR data acquisition are both set to one of the values in the resonance interval sequence, in particular, the central transmission frequency and the central reception frequency for the acquisition are set to the same offset frequency value. 3D MR data is acquired at block 82 using the scan parameters and sequences configured and determined in the previous steps of technique 70. In an embodiment of the invention, the 3D MR data is acquired using non-parallel imaging techniques. The 3D MR data may be acquired via multi-channel RF coil 56 of FIG. 1 or via another multi-channel receive coil. However, it is contemplated that parallel imaging techniques such as ARC, and the like may also be used and that multiple multi-channel receive coils may be used to acquire the 3D MR data. At block 84, it is determined if another 3D MR data acquisition should be performed. If all the offset frequency values in the resonance interval sequence have not been used 86, then process control returns to block 80 for setting the central transmission and central reception resonance frequencies for the next 3D MR data acquisition to another of the offset frequency values in the resonance interval sequence and at block 82 3D MR data for another 3D MR data set is acquired as described above. If all the offset frequency values in the resonance interval sequence have been used 88, a frequency image, $I^f(x, y, z, f)$, is reconstructed at block 90 for each MR data set acquired, resulting in a collection of images. Each image is reconstructed using known reconstruction techniques.

At block 92, the frequency images or spectral data, $I^f(x, y, z, f)$, are converted or transformed into composite image-space data bins or temporal images, $I^t(x, y, z, t)$, that can be analyzed in the complex plane. According to an embodiment of the invention, a Fourier transformation in the spectral domain at each pixel in the imaging volume is used to convert the data to temporal images:

$$I^f(x, y, z, f) \rightarrow FT \rightarrow I^t(x, y, z, t). \quad \text{(Eqn. 1)}$$

Through the Fourier transform, the frequency spectral bins are summed and phased relative to one another.

At block 94, a phase image is calculated or generated based on the plurality of temporal images or bins, $I^t(x, y, z, t)$. In one embodiment, the phase image is calculated based on the phase between a pair of the temporal bins, which may be temporally adjacent or may be temporally non-adjacent temporal bins in the case of three or more converted temporal bins. In another embodiment, the phase image may be generated based on all of the converted temporal bins, whether two or more temporal bins were converted. In yet another embodiment, the phase image may be calculated from an average of a plurality of phase images generated based on the phase between each neighboring pair of temporal bins.

Figure 3:
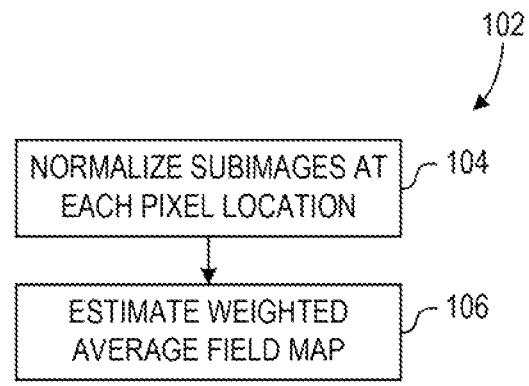
FIG. 3 is a technique for constructing a magnetic field map according to an embodiment of the invention.

In an embodiment of the invention, a magnetic field map may optionally be generated at block 96 based on the frequency images $I^f(x, y, z, f)$. Referring to FIG. 3, technique 102 spatially corrects the frequency images $I^f(x, y, z, f)$ relative to one another in the frequency-encoded dimension. At block 104, the frequency images $I^f(x, y, z, f)$ are normalized at each pixel location according to:

$$\sum_{b=1}^{N_b} I_b^f(x, y, z, f) = 1 \forall x, y, z, f, \quad \text{(Eqn. 2)}$$

where $N_b$ represents the number of frequency images $I^f(x, y, z, f)$.

Using the normalized image intensities resulting from Eqn. 2, a weighted average field map, $\Delta v_0(x, y, z, f)$, is estimated at block 106 according to:

$$\Delta v_0(x, y, z, f) = \sum_{b=1}^{N_b} I_b^f(x, y, z, f) \cdot v_0^b, \quad \text{(Eqn. 3)}$$

where $v_0^b$ represents the spectral offset of each frequency image $I^f(x, y, z, f)$.

Figure 4:
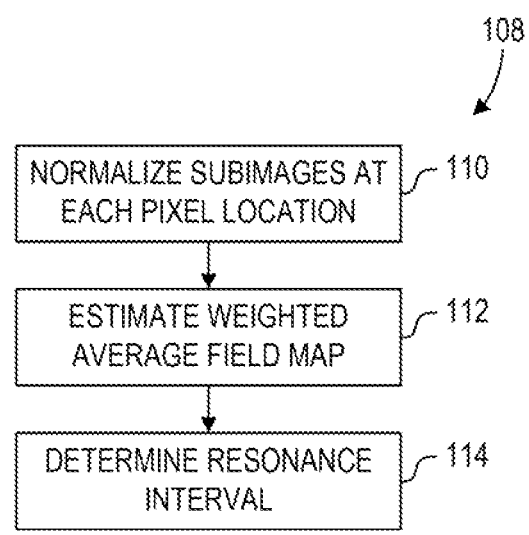
FIG. 4 is a technique for constructing a magnetic field map according to another embodiment of the invention.

In another embodiment of the invention, the magnetic field map may be generated at block 96 based on the technique 108 shown in FIG. 4. At block 110, a plurality of reconstructed MR frequency images are selected. In one embodiment, the plurality of reconstructed MR frequency images are retrieved from an image storage location such as memory 26 shown in FIG. 1 or another computer readable storage medium. The plurality of reconstructed frequency images may be generated using the technique described above with respect to FIG. 2. In another embodiment, the plurality of reconstructed MR frequency images may be generated on-the-fly. For example, the plurality of MR frequency images may be generated using the technique described above with respect to FIG. 2. At block 112, the pixels for each of the plurality of MR frequency images are examined to determine, for each pixel location, which image of the plurality of MR images has the maximum intensity. At block 114, each pixel location in the magnetic field map is assigned the offset frequency value, or $B_0$ value, to which the central transmission and central reception resonance frequencies are set to in the image determined to have the maximum intensity for the corresponding pixel location. For example, for a given magnetic field map pixel location, the image acquired with the central transmission and central reception resonance frequencies set to 3 kHz may have the maximum intensity for the corresponding pixel location. Accordingly, the value of 3 kHz is used for the given magnetic field map pixel location. For an adjacent magnetic field map pixel location, it may be determined that the image acquired with the central transmission and central reception resonance frequencies set to −4 kHz may have the maximum intensity for the corresponding pixel location. Accordingly, the value of −4 kHz is used for the adjacent magnetic field map pixel location.

Returning to FIG. 2, the magnetic field map generated from technique 102 or technique 108 is then used in this embodiment at block 98 to subtract macroscopic phase trends from the phase image generated at block 94 such that only the high-frequency phase variations remain in the phase image. At block 100, the phase image (or the modified phase image if modified using the magnetic field map) may be displayed to a user and/or stored in an image storage database.

Embodiments of the invention allow for the removal of $B_0$ perturbations from metal implants that contaminate raw phase image data to expose finer scale phase variations within the image. Such a phase-contrast mechanism allows easier identification of potential MR phase-based differentiators of local tissue reactions near joint replacements, for example.

A technical contribution for the disclosed method and apparatus is that is provides for a computer implemented method for generating MR phase contrast images from a region-of-interest (ROI) near metal.

Therefore, in accordance with an embodiment of the invention, a magnetic resonance (MRI) apparatus includes an MRI system having a plurality of gradient coils positioned about a bore of a magnet, and an RF transceiver system and an RF switch controlled by a pulse module to transmit RF signals to an RF coil assembly to acquire MR images. The MRI apparatus also includes a computer programmed to acquire a plurality of three-dimensional (3D) MR data sets and to generate a plurality of frequency images based on the plurality of 3D MR data sets. Each 3D MR data set is acquired using a central transmit frequency and a central receive frequency set to an offset frequency value that is distinct for each 3D MR data set. The computer is also programmed to convert the plurality of frequency images to a plurality of time domain images and to generate a phase image based on the plurality of time domain images.

In accordance with another embodiment of the invention, a method of magnetic resonance (MR) imaging includes determining a distinct central frequency for each of a plurality of 3D MR data acquisitions, performing the plurality of 3D MR data acquisitions, each 3D MR data acquisition having a central transmit frequency and a central receive frequency set to the distinct central frequency determined therefor, and reconstructing a frequency image for each of the plurality of 3D MR data acquisitions. The method also includes generating a plurality of temporal images based on the reconstructed frequency images and generating a phase image based on the plurality of temporal images.

In accordance with yet another embodiment of the invention, a computer readable storage medium having stored thereon a computer program comprising instructions, which, when executed by a computer, cause the computer to set a center transmission frequency and a center reception frequency of a first 3D MR acquisition equal to a first center frequency offset, to execute the first 3D MR acquisition to acquire a first set of 3D MR data, and to set a center transmission frequency and a center reception frequency of a second 3D MR acquisition equal to a second center frequency offset different than the first center frequency offset. The computer program also causes the computer to execute the second 3D MR acquisition to acquire a second set of 3D MR data, to reconstruct a frequency image for each of the first and second sets of 3D MR data, to convert the frequency images to respective first and second time domain images, and to generate a phase image based on the first and second time domain images.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A magnetic resonance imaging (MRI) apparatus that generates magnetic resonance (MR) phase contrast images near metal comprising:
    an MRI system having a plurality of gradient coils positioned about a bore of a magnet, and an RF transceiver system and an RF switch controlled by a pulse module in order to transmit RF signals to an RF coil assembly in order to acquire MR images, from an imaging volume near metal; and
    a computer of the MRI apparatus programmed to:
        acquire a plurality of three-dimensional (3D) MR data sets from the imaging volume near metal, each acquired 3D MR data set being acquired using a central transmit frequency and a central receive frequency which is set to an offset frequency value that is distinct for each acquired 3D MR data set;
        generate a plurality of frequency images based on the plurality of acquired 3D MR data sets;
        convert the plurality of generated frequency images to a plurality of time domain images by applying a Fourier transformation to the generated plurality of frequency images and
        generate a MR phase contrast image of the imaging volume near metal, based on the converted plurality of temporal, time domain images: and
        display the MR phase contrast image of the imaging volume near metal on a display monitor.

2. The MRI apparatus of claim 1 wherein the computer is further programmed in order to generate a magnetic field map based on the plurality of generated frequency images.

3. The MRI apparatus of claim 2 wherein the computer is further programmed in order to remove low spatial frequency phase from the generated MR phase contrast image of the imaging volume near metal based on the magnetic field map.

4. The MRI apparatus of claim 1 wherein the plurality of temporal time domain images comprises more than two temporal time domain images; and wherein the computer, that is programmed to generate the phase contrast image of the imaging volume near metal, is also programmed in order to generate the phase contrast image of the imaging volume near metal based on a phase existing between a pair of the plurality of temporal time domain images.

5. The MRI apparatus of claim 4 wherein the pair of the plurality of temporal time domain images corresponds with temporally non-adjacent time domain images.

6. The MRI apparatus of claim 1 wherein the computer, in being programmed to generate the phase contrast image of the imaging volume near metal, is also programmed in order to generate the phase contrast image of the imaging volume near metal based on utilizing all of the plurality of temporal time domain images.

7. The MRI apparatus of claim 1 wherein the computer, in being programmed to generate the phase contrast image of the imaging volume near metal, is also programmed in order to generate the phase contrast image of the imaging volume near metal, based on an average of the phases existing between each neighboring pair of temporal time domain images.

8. The MRI apparatus of claim 1 wherein the computer is further programmed in order to acquire each of the plurality of 3D MR data sets without slab selection being performed by via imaging gradients.

9. The MRI apparatus of claim 8 wherein the computer is further programmed in order to acquire each of the plurality of 3D MR data sets using a receiver bandwidth of at least +/−125 kHz.

10. The MRI apparatus of claim 1 wherein the computer is further programmed in order to interleave offset frequency values that are used to acquire the plurality of 3D MR data sets such that sequential 3D MR data sets are acquired using non-sequential offset frequency values.

11. A method of magnetic resonance (MR) imaging that generates magnetic resonance (MR) phase contrast images near metal comprising:

determining with a magnetic resonance imaging system, a distinct central frequency for each of a plurality of 3D MR data acquisitions which occur near metal;

performing the plurality of 3D MR data acquisitions, using a magnetic resonance imaging system, with each 3D MR data acquisition which occur near metal having a central transmit frequency and a central receive frequency that is set to the distinct central frequency determined therefor;

reconstructing, with an image processor, a frequency image for each of the plurality of 3D MR data acquisitions occurring near metal;

generating with the image processor a plurality of temporal images based on the reconstructed frequency images by applying a Fourier transformation to the plurality of reconstructed frequency images;

generating a near metal phase contrast image based on the plurality of temporal images with the image processor and displaying the near metal phase contrast image on a display monitor.

12. The method of claim 11 further comprising:

generating a magnetic field map of the magnetic resonance imaging system based on the reconstructed frequency images; and removing low spatial frequency phase from the near metal phase contrast image, using the image processor based on the generated magnetic field map.

13. The method of claim 11 wherein generating the near metal phase contrast image comprises calculating, with the image processor, the phase existing between a pair of temporally adjacent temporal images.

14. The method of claim 13 wherein generating the near metal phase contrast image comprises calculating, with the image processor, the phase existing between a pair of temporally non-adjacent temporal images.

15. The method of claim 11 wherein generating the near metal phase contrast image comprises calculating, with the image processor, an average of the phases existing between each neighboring pair of temporal images.

\* \* \* \* \*